US006200866B1

United States Patent
Ma et al.

(10) Patent No.: US 6,200,866 B1
(45) Date of Patent: Mar. 13, 2001

(54) USE OF SILICON GERMANIUM AND OTHER ALLOYS AS THE REPLACEMENT GATE FOR THE FABRICATION OF MOSFET

(75) Inventors: Yanjun Ma, Vancouver; Douglas J. Tweet, Camas, both of WA (US); David R. Evans, Beaverton, OR (US); Yoshi Ono, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/410,346

(22) Filed: Sep. 30, 1999

Related U.S. Application Data

(63) Continuation-in-part of application No. 09/028,157, filed on Feb. 23, 1998.

(51) Int. Cl.[7] .................. H01L 21/338; H01L 21/336; H01L 21/8234; H01L 21/8242

(52) U.S. Cl. .................. 438/299; 438/184; 438/183; 438/230; 438/164; 438/197; 438/240

(58) Field of Search .................. 438/184, 183, 438/230, 299, 197, 240, 164

(56) References Cited

U.S. PATENT DOCUMENTS

| 5,856,225 | * | 1/1999 | Lee et al. .................. 438/291 |
| 5,858,843 | * | 1/1999 | Doyle et al. .................. 438/299 |
| 5,955,759 | * | 9/1999 | Ismail et al. .................. 257/332 |

OTHER PUBLICATIONS

Article entitled "CMOS Metal Replacement Gate Transistors Using Tantalum Pentoxide Gate Insulator" presented at Int'l Electron Devices Mtg., 12–6,9–98, by Chatterjee, et al., pp 29.2.2–29.1.4.

Article entitled "High Performance Metal Gate MOSFETs Fabricated by CMP for 0.1$\mu$m Regime" presented at Int'l Electron Devices Mtg., 12–6,9–98, by Yagishita, et al., pp 29.3.1–29.3.4.

Article entitled A Polycrystalline SiGe Gate CMOS Technology, presented by Int'l Electron Devices Mtg., 12–6, 9–98, by King, et al., pp 10.4.1–10.4.4.

Article entitled Enhancement of PMOS Device Performance with Poly–SiGe Gate, published in IEEE Electron Device Ltrs., vol. 20, No. 5, May 1999, by Lee, et al., pp 232–234.

Article entitled Selective Removal of SiGe from (100) Si Using $HNO_3$ and HF, published in J. Electrochem Soc., vol. 139, No. 10, Oct. 1992, pp 2943–2947.

Article entitled "Etching Characteristics of SiGe Alloy in Ammociac Wet Cleaning", published in Appl. Phys. Lett. 57(21) Nov. 1990, pp 2202–2204.

* cited by examiner

*Primary Examiner*—Wael Fahmy
*Assistant Examiner*—Toniae M. Thomas
(74) *Attorney, Agent, or Firm*—David C. Ripma; Matthew D. Rabdau; Scott C. Krieger

(57) ABSTRACT

A method of fabricating a MOSFET is provided, including: depositing an oxide layer on a silicon substrate for device isolation; forming a silicon based alloy island above a gate region in the substrate, wherein the silicon based alloy comprises a silicon germanium alloy or a silicon tin alloy or another alloy of Group IV-B elements; building a sidewall about the silicon based alloy island; forming a source region and a drain region in the substrate; removing the silicon based alloy island, thereby leaving a void over the gate region; filing the void and the areas over the source region and the drain region; and planarizing the upper surface of the structure by chemical mechanical polishing. Alternative embodiments providing conventional and raised source/drain structures are disclosed.

14 Claims, 7 Drawing Sheets

USE OF SILICON GERMANIUM AND OTHER ALLOYS AS THE REPLACEMENT GATE FOR THE FABRICATION OF MOSFET

This application is a continuation-in-part of application Ser. No. 09/028,157, filed Feb. 23, 1998 entitled "Fabrication of a Planar MOSFET with Raised Source/Drain by Chemical Mechanical Polishing and Nitride Replacement," invented by David Russell Evans and Sheng Teng Hsu.

BACKGROUND AND SUMMARY OF THE INVENTION

This invention relates to the manufacture of integrated circuits, and specifically to the manufacture of MOSFET devices formed using a replacement gate.

Manufacturing of MOSFET semiconductors is well known in the art. Such structures are shown in U.S. Pat. No. 4,702,792 to Chow et al., which discloses a technique for making conductive channels of small size.

The replacement or "cast" process is a good candidate for fabricating transistors with a wide selection of gate materials. Due to the process controllability issues in current technology, however, the process is not widely used. The main obstacle to using the replacement gate process is control of the gate critical dimension during the gate replacement process.

Chatterjee et al. have written on the replacement gate process, specifically the use of polysilicon as the replacement gate material, in the IEDM Tech. Digest, page 777, 1998. The disadvantage of using polysilicon as the replacement gate material is the difficulty in removing the polysilicon using a wet-etch process that is selective over silicon dioxide.

Yagishita et al. have also written on the replacement gate process in the IEDM Tech. Digest, page 785, 1998. Yagishita also discloses the use of polysilicon as the replacement gate material.

Evans et al., in patent application Ser. No. 09/028,157, filed Feb. 23, 1998, of which this application is a continuation-in-part, discloses the use of silicon nitride as a replacement gate material. Using silicon nitride as the replacement gate material is effective but patterning the silicon nitride replacement gate using a dry etch process can be difficult. To optimize dry silicon nitride etch it is necessary that the etchant be selective over both silicon and silicon dioxide.

Heretofore, silicon germanium and other Group IV-B (Periodic Table—copyright© Sargent-Welch Scientific Company, 1979) elemental alloys have not been used as a dummy, or replacement, gate during the fabrication of a MOSFET device.

It would be advantageous to have a replacement gate MOSFET fabrication process with improved etch selectivity between the replacement gate material and the adjacent materials used in the spacers and other structures. Although the aforementioned references discuss the fabrication of a MOSFET device, they do not provide the advantages of the instant invention.

An object of the invention is to provide a method of manufacturing a MOSFET device wherein the source region and the drain region are formed before formation of the gate.

Another object of the invention is to provide a MOSFET device that may be constructed on both conventional silicon and silicon-on-insulator (SOI) substrates.

A further object of the invention is to provide for the fabrication of a MOSFET device that allows the use of any type of gate dielectric material.

Still another object of the invention is to provide for the fabrication of a MOSFET device having a highly conductive material, such as refractory metal or copper, as the gate electrode.

A further object of the invention is to provide for the fabrication of a MOSFET device wherein the fabrication process allows increased controllability of the etch process to achieve a desired critical dimension of the gate.

Accordingly, the method of the invention includes: forming a silicon germanium, or similar alloy island, the materials of the alloy being preferably selected from the elements of Group IV-B of the Periodic Table of Elements, above a gate region in the substrate; building an oxide or a nitride sidewall about the silicon germanium island (silicon germanium is used herein as a representative example of the preferred alloy of Group IV-B elements to be used); forming a source region and a drain region in the substrate; removing the silicon germanium island, without removing the sidewall around the island, thereby leaving a void over the gate region; and filling the void with a gate structure by steps which preferably include: forming a gate dielectric over the gate region in the void, and filling the remainder of the void with gate electrode material.

The step of removing the silicon germanium (or other Group IV-B alloy) island preferably includes depositing, over the island and the areas over the source region and the drain region, a non-island-material layer that permits the alloy of the island to be selectively dissolved or otherwise removed without simultaneously removing the non-island-material layer which was deposited. The non-island-material layer can be either polysilicon (alternatively known to those skilled in the art as polycrystalline silicon), when raised source/drain regions are to be provided, or a suitable dielectric such as silicon nitride or oxide, when conventional source/drain regions are provided. Following the filling of the void with a gate structure, the method preferably includes planarizing the upper surface of the structure by chemical mechanical polishing. In the embodiment of the invention wherein raised source/drain regions are formed, the method further preferable includes; depositing a metal layer on the upper surface of the structure; and metallizing the structure to form electrodes in electrical contact with the source region, the gate region, and the drain region.

DETAILED DESCRIPTION OF THE PREFERRED EMBODIMENTS

Figure 1:
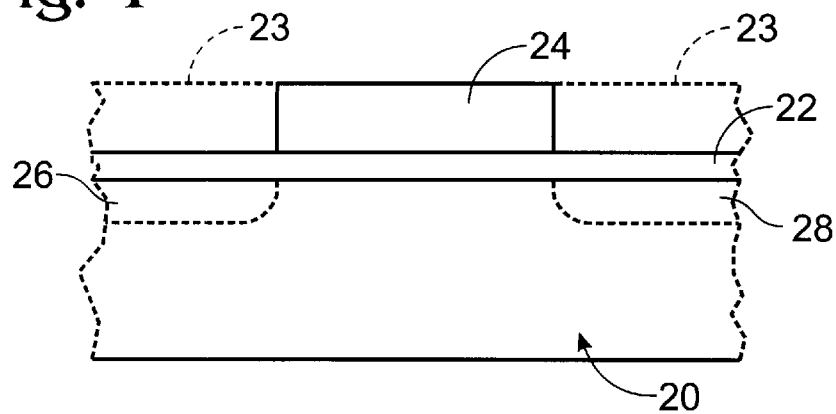
FIGS. 1–12 depict successive steps in the fabrication of a MOSFET device according to a first embodiment of the invention having raised source/drain regions.

Turning now to the drawings, and initially to FIG. 1, a substrate, which in this case is a single crystal silicon substrate, is depicted generally at 20. As used herein, "substrate" or "silicon substrate" means a bulk silicon, single crystal substrate, or a Silicon On Insulator (SOI) substrate, including a Separation by IMplantation of OXygen (SIMOX) substrate. Substrate 20 will have been specially processed to form an electrically active and/or isolated area suitable for subsequent fabrication of the device to be described herein. Preprocessing may include, without limitation, conventional n⁻ well and/or p⁻ well definition and isolation; trench isolation with polysilicon or oxide refills; conventional or fully recessed local oxidation (LOCOS); and/or SOI mesa structure, generated either by LOCOS or etching. Such steps may be combined, or used individually. A silicon-on-insulator (SOI) substrate may be fabricated by high dose oxygen implantation into single crystal silicon, along with subsequent annealing, to form a SIMOX, bonded silicon wafers and etchback, heteroepitaxy, etc. An example of SIMOX is implantation of oxygen at about 200 keV with an oxygen dose of 1 to $2 \cdot 10^{18}$ cm$^{-2}$. The wafer is then annealed at 1300° C. to 1350° C. for four to ten hours. The buried oxide thickness is about 300 nm. Once the preprocessing is complete, the substrate may be planarized, i.e., rendered globally planar by chemical mechanical polishing (CMP).

A layer of oxide 22 is formed on substrate 20 to a thickness of approximately 5–30 nm. (It should be noted that the drawings are not to scale.) Oxide layer 22 is referred to herein as pad oxide layer 22. A layer of material which is an alloy of Group IV-B elements of the periodic table is then deposited on the layer of oxide 22. In the illustrated example described first herein the alloy of Group IV-B elements is preferably polycrystalline silicon germanium, which is deposited to a thickness of about 150 nm to 500 nm by chemical vapor deposition (CVD). Silicon germanium will be used herein as a representative example of a suitable alloy of Group IV-B elements to serve as the "island" material, as will now be described.

The silicon germanium layer is represented preferably composed of $Si_{1-x}Ge_x$, where x typically is in the range of 0.1 to 0.5, but may be anywhere in the range of about 0.05 to about 1.0. The layer of the silicon germanium alloy is formed into silicon germanium island 24 in FIG. 1 by a process of photolithography and anisotropic plasma etching of the deposited silicon germanium layer. The areas of silicon germanium removed by etching are indicated with dashed lines at 23 in FIG. 1. The etching of regions 23, outside island area 24, is stopped at the pad oxide layer 22. In other words, the silicon germanium layer 23 is masked in the gate region and then the remainder of the silicon germanium is etched to form island 24. The pad oxide layer 22 outside the masked "island" area 24 can be partially etched or be completely removed during this etch process, although it can also be left to serve as an etch stop in later steps. In the illustrative embodiment herein the pad oxide layer 22 is not removed.

The silicon germanium island 24 forms a replacement "cast" for the gate electrode. In other words, silicon germanium island 24 forms a dielectric image of what will become the gate electrode. This image preferably will be used as a pattern or form for the formation of a metal gate electrode, or a gate electrode of another material, without a separate photolithography step, as will be described later herein. For example, the image of the island 24 may be transferred into a heavily doped polysilicon or a polysilicon germanium alloy material gate electrode.

The figures herein depict the formation of a MOSFET transistor which can be either a n-channel or p-channel type. If both types are formed simultaneously during manufacturing, photoresist is used to mask the n channel transistors during p⁻ Low Dose (or Lightly Doped) Drain (LDD) ion implantation. LDD formation refers to a low dose ion implantation which is used to describe, generally, low dose ion implantation regardless of the intended use of the region being implanted. The p⁻ LDD regions, 26 and 28, shown in FIG. 1, are formed by BF$_2$ ion implantation or plasma doping. The preferred ion dose is 5 to $50 \cdot 10^{13}$ cm$^{-2}$ and the BF$_2$ ion energy is 10 keV to 80 keV. The ion energy is sufficiently low so that no ions are implanted through the silicon germanium layer. The photoresist is then stripped and a new photoresist is used to mask the p channel transistors for n⁻ LDD ion implantation. The n⁻ LDD region is formed by implantation of arsenic or phosphorus ions at an ion dose of 5 to $50 \cdot 10^{13}$ cm$^{-2}$ and an ion energy of 40 keV to 100 keV for arsenic or an ion energy of 10 keV to 60 keV for phosphorous. The illustrated transistor shown in the figures represents either an n channel or p channel transistor. Raised source/drain formations may alternatively be used to prepare the illustrated source/drain regions 26, 28, as is well known to those skilled in the art.

Figure 2:
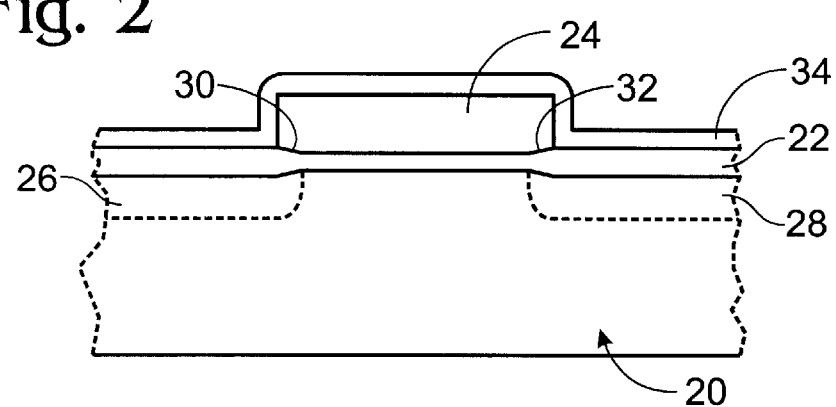

An optional step of oxidation may be performed for the purpose of thickening the pad oxide 22, which results in the formation of a "bird's beak" at the edge of the island, as is depicted at 30 and 32 in FIG. 2. The bird's beak may enhance the breakdown voltage of the gate oxide at the edge of the gate electrode. The oxidation step is carried out by heating the structure of FIG. 1 in oxygen, thickening the pad oxide regions 22 not covered by "island" 24, as is well known. During this oxidation step the ions in the LDD region are diffused and are extended beyond the length of the bird's beak, as shown in FIG. 2. A silicon nitride layer 34 is deposited over the structure by any state-of-the-art process, such as Plasma-Enhanced Chemical Vapor Deposition (PECVD) or Low Pressure Chemical Vapor Deposition (LPCVD), resulting in the configuration shown in FIG. 2. In another embodiment, an oxide may be used as the material for layer 34.

Figure 3:
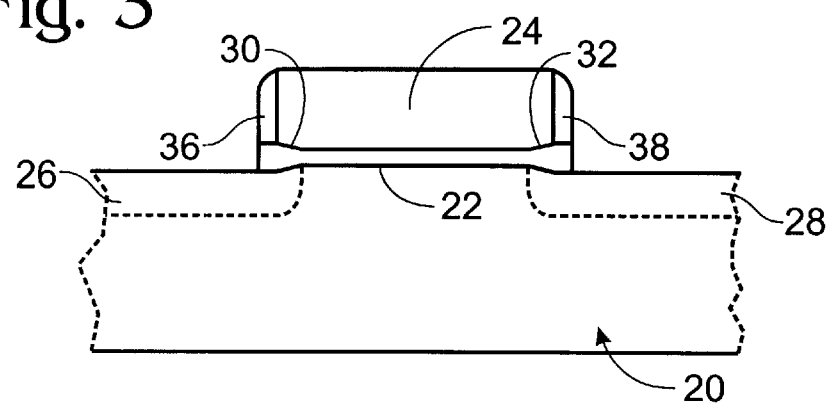

Assuming silicon nitride is used in layer 34 (FIG. 2), the wafer is then subjected to an anisotropic nitride etch, which leaves a thin layer of nitride 36 and 38 about the sidewall of the silicon germanium layer, as shown in FIG. 3.

Figure 4:
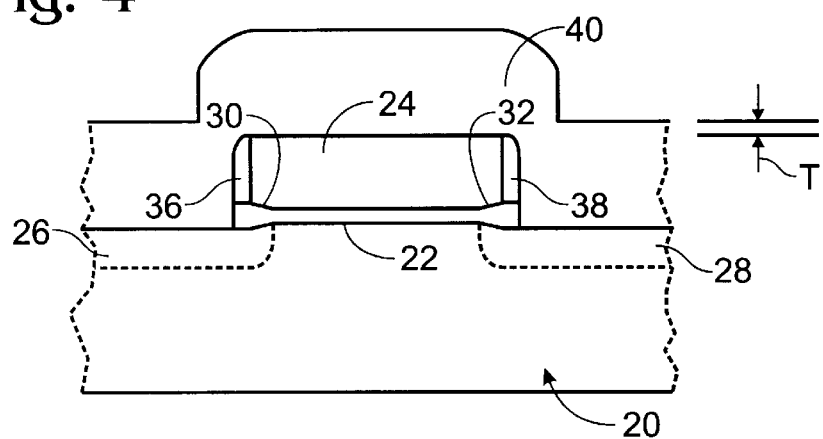

Referring now to FIG. 4, a layer of material different from the alloy of Group IV-B elements used in island 24 is deposited onto the structure of FIG. 3. Layer 40 (FIG. 4) is referred to as formed of non-island-material because it needs to be different from the material of island 24, to allow for convenient removal of the island without simultaneous removal of the material used in layer 40. In the first embodiment of the invention layer 40 is preferably deposited polysilicon. Polysilicon layer 40 is deposited onto the wafer onto the alloy island, the island sidewalls, and the source and the drain regions. Layer 40 is thicker than silicon germanium layer 24 by an amount "T". Layer 40 is alternatively referred to herein as first polysilicon layer 40. The structure is then treated by CMP to expose the silicon germanium island 24, as shown in FIG. 5.

A photoresist mask 33 is then applied to cover the device active area. Polysilicon layer 40 in the field regions 35 (shown with cross-hatching in FIG. 6) is not covered by the resist. The polysilicon layer 40 and any suitable portion of substrate 20 are etched, removing field regions 35. The resist layer 33 is then stripped. At this point only the source region 26 and the drain region 28 of both p⁻ channel and n⁻ channel transistors are covered with polysilicon layer 40. The wafer is then coated with a layer of oxide (shown with dashed line 37 in FIG. 6) having a thickness equal to or greater than the depth of the oxide to be deposited in field regions 35. The oxide is CMP planarized, stopping at the upper surface of the polysilicon and silicon germanium layers. A high selectivity slurry which removes oxide more quickly than polysilicon is desirable for this process. This results in isolating oxide regions 41, as shown in FIGS. 7 and 8, which surrounds the polysilicon layer 40. Region 41 insulates the devices on a substrate from one another. Region 41, shown only in FIGS. 7 and 8, should be understood to be present in the other drawing figures after the steps described in connection with FIGS. 5 and 6.

Figure 5:
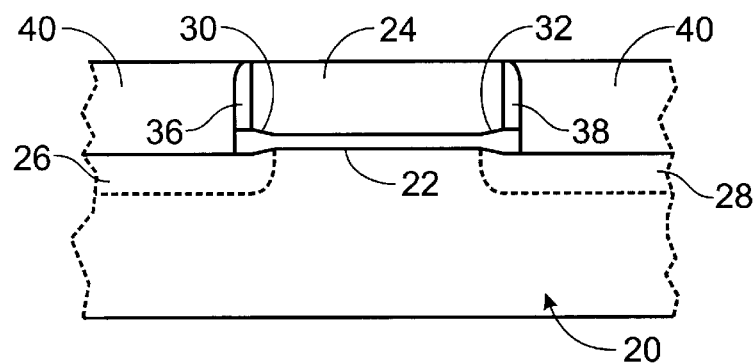
Figure 6:
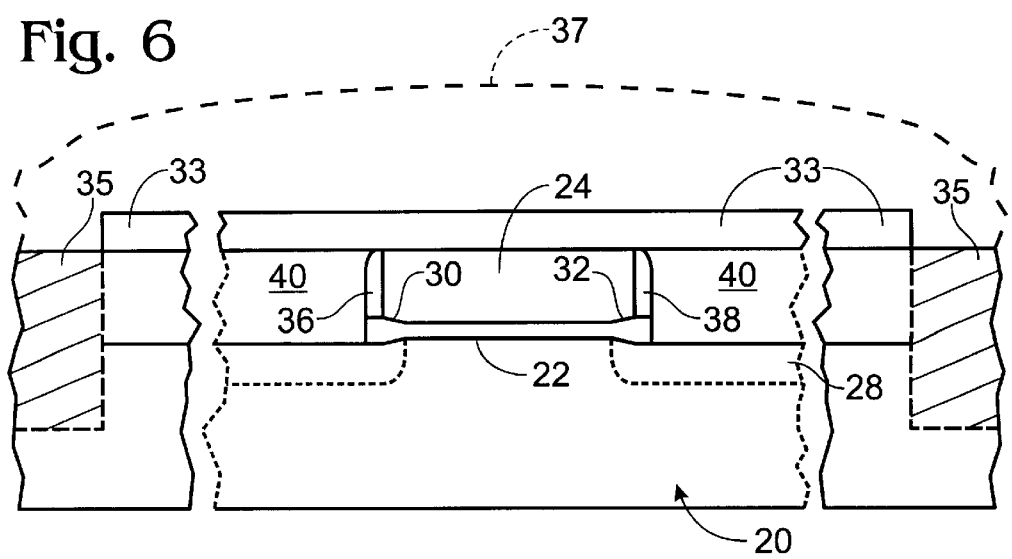
Figure 7:
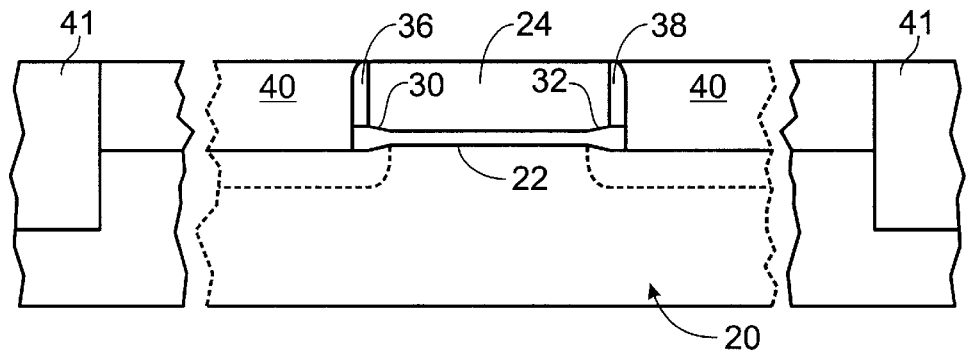
Figure 8:
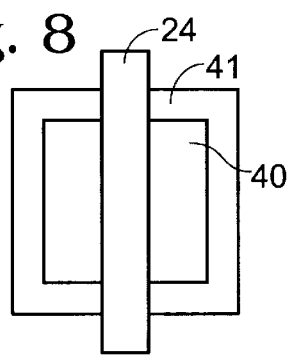

The next step is source/drain ion implantation into the polysilicon regions 40 which remain in FIGS. 5–7. Assuming both p and n channel devices are being processed, and implanting is first performed on the p channel devices, photoresist is applied to mask the n channel transistors. The p channel source/drain regions, which in FIG. 5 include polysilicon regions 40, are implanted with $BF_2$ ions. The preferred ion dose is 1.0 to $5.0 \cdot 10^{15}$ $cm^{-2}$ and the $BF_2$ ion energy is 10 keV to 80 keV. Again, the ion energy is sufficiently low so that no ions are implanted through the gate dielectric layer and into the channel region. This ion implantation creates a raised $p^+$ source region and $p^+$ drain region for a p channel transistor. The photoresist is stripped and a new photoresist is used to mask the p channel transistors for n channel source/drain ion implantation.

The n channel source/drain is formed by implantation of arsenic (or phosphorus) ions at an ion dose of 1.0 to $5.0 \cdot 10^{15}$ $cm^{-2}$ and an arsenic ion energy of 40 keV to 100 keV, or phosphorous energy of 10 keV to 60 keV. The masking resist is stripped and the wafer annealed in an inert gas ambient atmosphere at a temperature of between about 800° C. to 1100° C. for 15 seconds to 60 minutes. The source and drain of the p channel transistor are doped to $p^+$, while the corresponding regions of the n channel transistor are doped to $n^+$.

Figure 9:
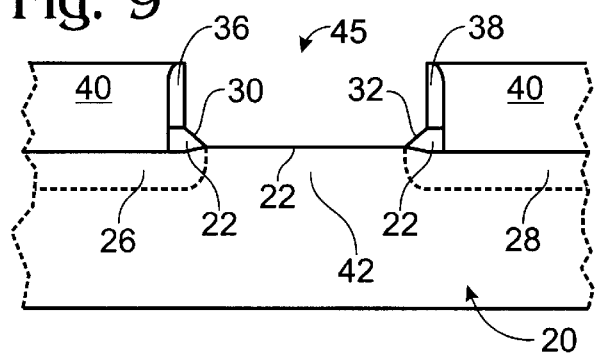

Referring to FIG. 9, silicon germanium island 24 is removed by any one of several methods, such as a highly selective wet etch. There are several wet etch processes that selectively remove silicon germanium over silicon, including a mixture of acetic acid, nitric acid and HF, which shows a selectivity of etching silicon germanium over silicon of better than 100 to one, and better than 1,000 to one over silicon dioxide. A mixture of $NH_4OH$, $H_2O_2$ and water will selectively etch silicon germanium at least five times faster than silicon. A mixture of $H_2O_2$, HF and water will also selectively etch silicon germanium over silicon. Any of these wet etch processes will result in the configuration shown in FIG. 9. Due to the high selectivity and pattern control feasible during etching of silicon germanium island 24, the critical dimension, i.e., the length of the gate, can be controlled. In other words, the inner side walls of spacers 36 and 38 remain approximately normal to the surface of the gate region during the process disclosed herein so that the critical dimension of the gate is not altered during the fabrication steps. In the embodiment shown, the gate has a critical dimension of between 0.10 and 0.2 microns, and preferably about 0.13 microns, which extends across the width of the gate region from region 26 to region 28. The removed area, where island 24 was, over what will ultimately become the channel region 42 of the completed transistor, is referred to herein as void 45. Void 45 is alternatively referred to as the void over the gate region.

Upon removal of the silicon germanium, a remnant of the original pad oxide 22 is exposed, and is indicated only by a line 22 in FIG. 9. Although this oxide layer could serve as the gate dielectric, it is unlikely that the remains of the pad oxide would be uncontaminated or undamaged following removal of the silicon germanium island. Pad oxide 22 could serve as a screen oxide for an unmasked threshold adjustment implant which would, of course, certainly result in the contamination of oxide pad 22. Once oxide pad 22 is removed, a channel region 42 is exposed, which requires placement of some form of gate dielectric thereover.

While the simplest approach to forming a gate dielectric is re-growth of a dielectric on the exposed silicon in channel region 42, such re-growth will result in edge thinning, which will ultimately cause the resulting device to have an undesirable low gate breakdown voltage. This effect may be reduced by judicious design of the aforementioned oxidation step described with reference to FIG. 2, above. During the oxidation step, bird's beak 30, 32 is formed around the periphery of the silicon germanium island, resulting in thickening of the pad oxide at the edge of the gate. If the remnant pad oxide strip is carefully controlled, a "toe" will be formed at the bottom of the spacer (36, 38), which offsets the edge thinning.

Alternatively, gate dielectric may be formed by some form of deposition. This may be advantageous because materials other than silicon oxide may be used, which other materials have desirable material properties such as a high dielectric constant and/or a high breakdown strength, such as AlN, $Al_2O_3$, $TiO_2$, $ZrO_2$, or $Ta_2O_5$. In addition, zirconium oxide and hafnium oxide compounds may be used, such as aluminum doped zirconium oxide, silicon doped zirconium oxide, hafnium oxide, aluminum doped hafnium oxide, and silicon doped hafnium oxide. In these instances, LOCOS is not needed and the step may be deleted from the process flow. The materials may be deposited by CVD, PVD, or atomic layer deposition (ALD). The end result, regardless of which method is used, is the formation of a gate dielectric layer 44, as shown in FIG. 10.

Figure 10:
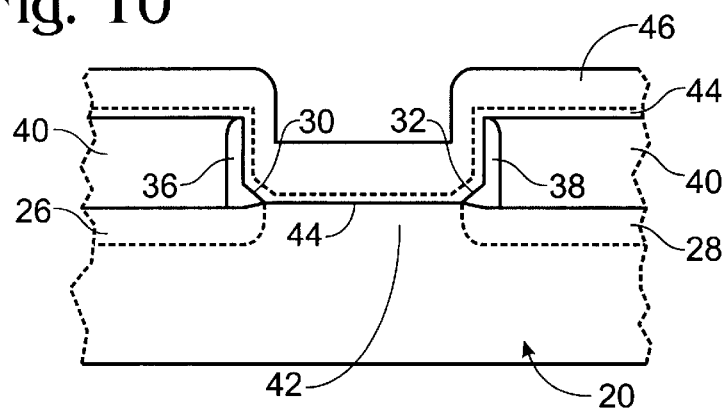
Figure 11:
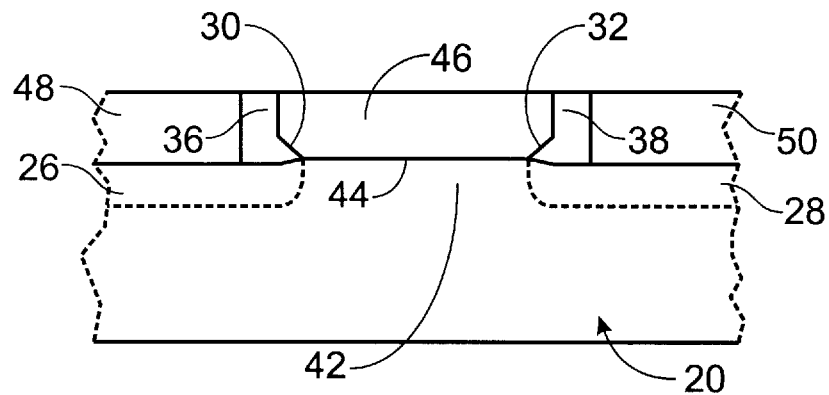

After formation of gate dielectric 44, gate electrode material 46 is deposited over the entire structure, resulting in the configuration depicted in FIG. 10. The deposited layer 46 may be polysilicon. Material other than polysilicon, however, may be used to fill the void and extend over the source, gate and drain regions. A refractory metal, such as tungsten (W), tantalum (Ta), platinum (Pt), or molybdenum (Mo), or copper (Cu) in combination with a barrier metal, such as titanium nitride (TiN), tantalum nitride (TaN) or tungsten nitride (WN), may be used. In another embodiment, polysilicon germanium may also be used for formation of the gate. Once the structure is covered with whatever material is selected, the structure undergoes global planarization by CMP to remove portions of polysilicon layer 40 and gate material layer 46, as well as portions of sidewall spacers 36, and 38, resulting in the structure shown in FIG. 11.

Figure 12:
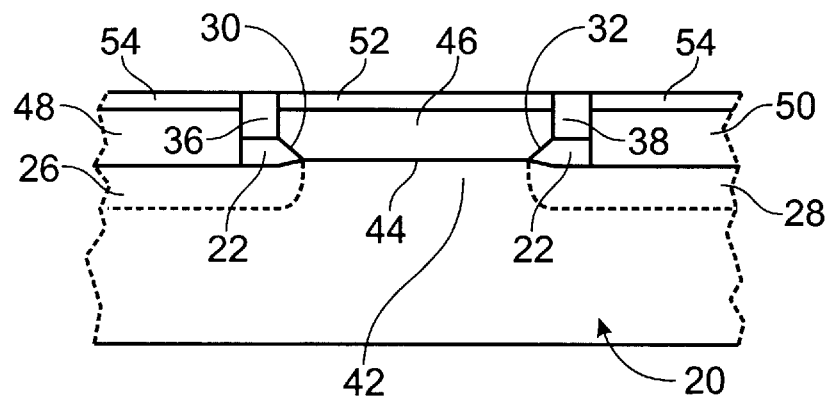

An optional salicide (self-aligned silicide) process may be performed to minimize the parasitic resistance of the gate, source, and drain electrodes. Referring to FIG. 12, silicide layers 52, and 54 may be formed by any state-of-the-art salicide process, such as by annealing. A problem in the salicide prior art is that the gate may be shorted to the source and/or drain by unetched metal which remains on spacer 36, 38. This problem is resolved by a "touch polish", a very short CMP step.

The device of FIG. 12 is now ready for conductor metallization, which may be accomplished by any of the techniques well know to those of skill in the art to form electrodes for the source region, gate region, and drain region, which electrodes are in electrical contact with their respective regions. This may be accomplished by conventional patterning and etching metallizations, such as with an aluminum alloy. However, because the surface is already globally planarized, an inlaid metallization using copper and CMP may easily be implemented.

Figure 13:
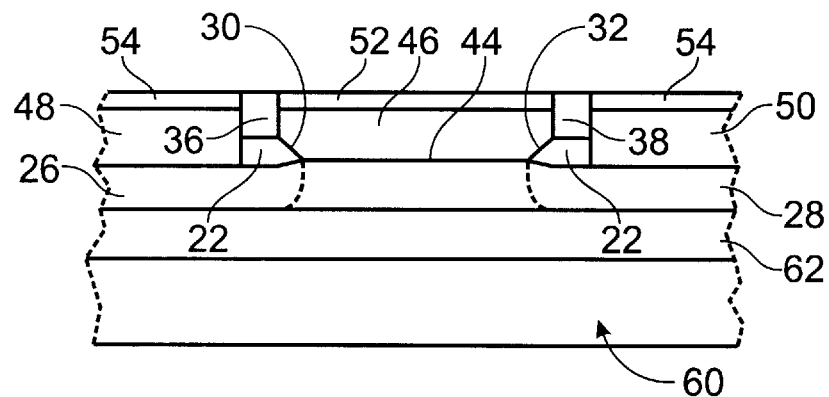
FIG. 13 depicts the device on a SOI substrate.

Referring now to FIG. 13, the structure is shown on a SIMOX substrate, having a bulk silicon layer 60 and a buried oxide layer 62. The remaining structures are indicated by previously used reference numbers for like elements.

Figure 14:
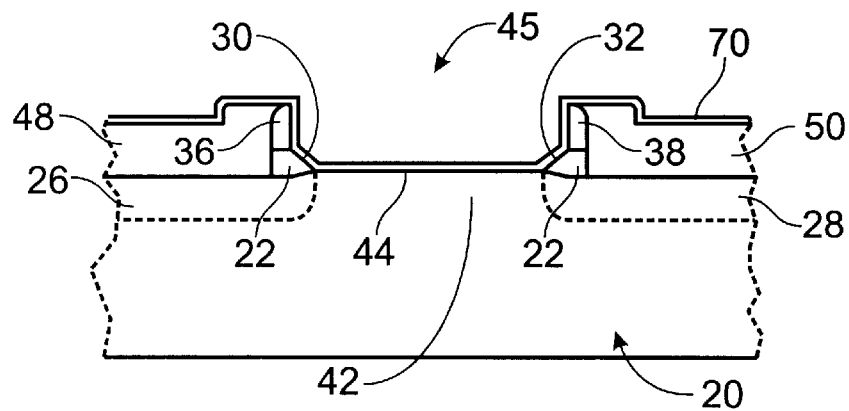
FIG. 14 depicts the device structure after deposition of a barrier layer in an alternative embodiment of the invention.
Figure 15:
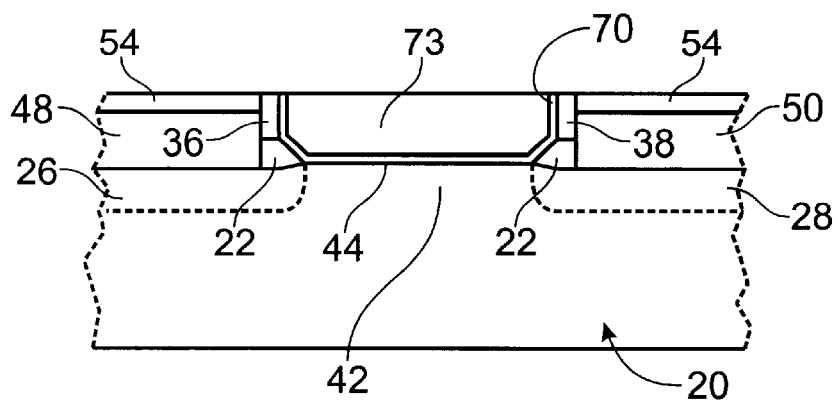
FIG. 15 depicts the completed device structure with deposited barrier layer.
Figure 16:
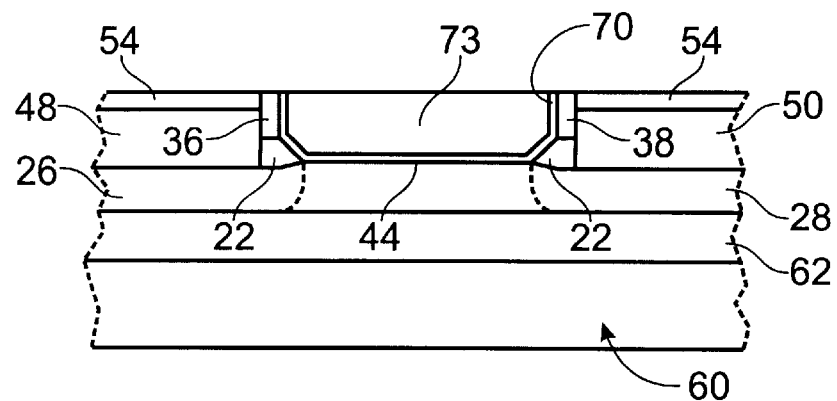
FIG. 16 depicts the completed structure with deposited gate barrier layer on a SIMOX substrate.

FIGS. 14 and 15 show an alternative embodiment of the invention wherein a barrier layer is deposited in the void 45 of FIG. 9. Barrier layer 70 is preferably a suitable barrier material such as titanium nitride (TiN), tantalum nitride (TaN) or tungsten nitride (WN) used with a copper gate electrode 73 which is subsequently deposited in void 45 (see FIG. 15). The excess barrier material on the source and drain regions is removed by CMP, which results in a natural self-alignment of the barrier material to the gate electrode 73 as shown. FIG. 16 shows the embodiment of FIG. 15 on a SIMOX substrate. The gate dielectric 44 in FIGS. 14–16 is provided by any suitable means such as deposition of a high dielectric constant material such as $Ta_2O_5$, $TiO_2$, $ZrO_2$, $HfO_2$, any of which may optionally be doped with either Si or Al, or other suitable dielectric materials. A similar process can be used to provide the gate dielectric 44 in the embodiment shown and described with reference to FIG. 10.

Other Group IV-B alloys such as SiSn may also be used as the dummy, or replacement, gate in the process described above. Similar processing steps and process variables may be used in the silicon germanium and in the silicon tin alloy processes based on the similar chemical properties of these materials. These new dummy gate materials may also be used for the fabrication of other devices such as ferroelectric memories.

Figure 17:
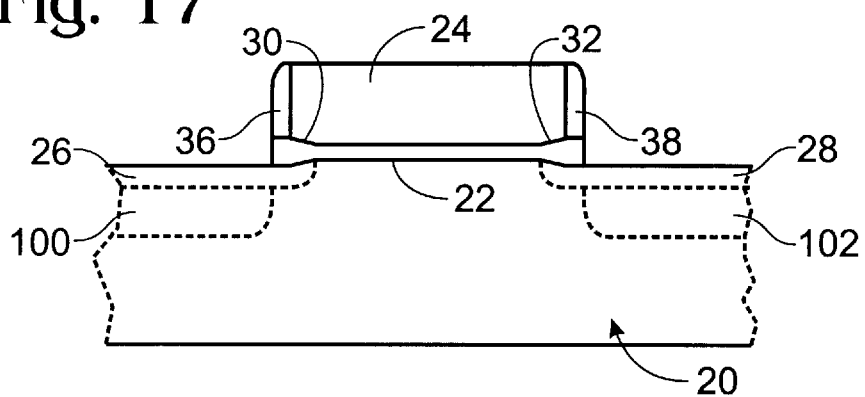
FIGS. 17–22 depict successive steps in the fabrication of a MOSFET device according to another alternative embodiment of the invention.
Figure 18:
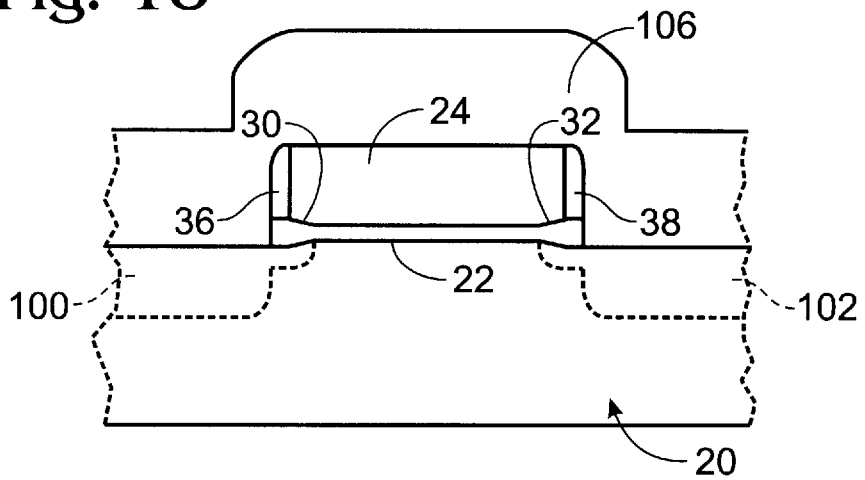

The previously-described embodiments of the invention use a raised source/drain configuration; the embodiment of FIGS. 17–22 has a conventional source/drain architecture. FIGS. 17, 18, 19, and 20 show, respectively, steps equivalent to those of the first embodiment shown in FIGS. 3, 4, 5, and 9 and like reference numbers are used for like elements in both sets of figures. In FIG. 17, following formation of island 24 and sidewall spacers 36, 38, an implantation step is performed to implant suitable p- or n-type dopants (depending on the conductivity type of the device being formed) into the substrate 20. After a suitable anneal is performed to activate the dopants, the result is the formation of source and drain regions 100, 102.

Figure 19:
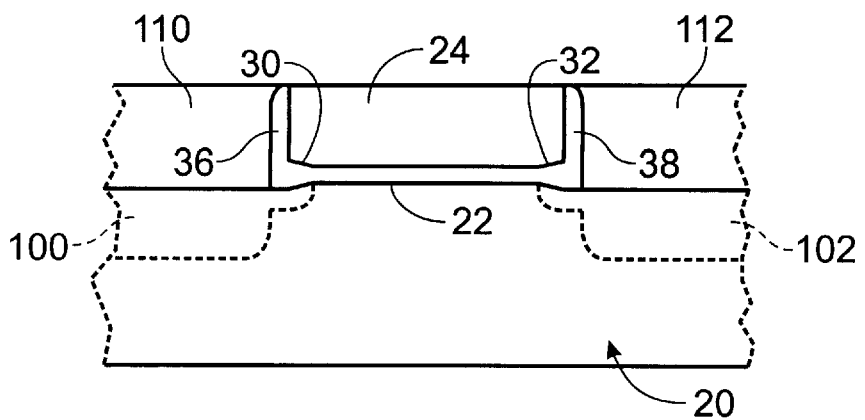

In this embodiment, the next step (FIG. 18) is to deposit a layer of dielectric 106, such as silicon dioxide, onto the alloy island, the island sidewalls, and the source and the drain regions. Layer 106 is also called the non-island-material deposited over the aforementioned structures, or the "first layer of dielectric material." As with layer 40 in FIG. 4, layer 106 is thicker than silicon germanium ("island") layer 24 by an amount "T" (see FIG. 4). The structure is then treated by CMP to expose the silicon germanium island 24, as shown in FIG. 19. In FIG. 19, source/drain regions 100/102 are covered by silicon dioxide layers 110/112, respectively. The formation of field regions for device isolation can be carried out as shown and described with reference to FIGS. 6–8, above.

Figure 20:
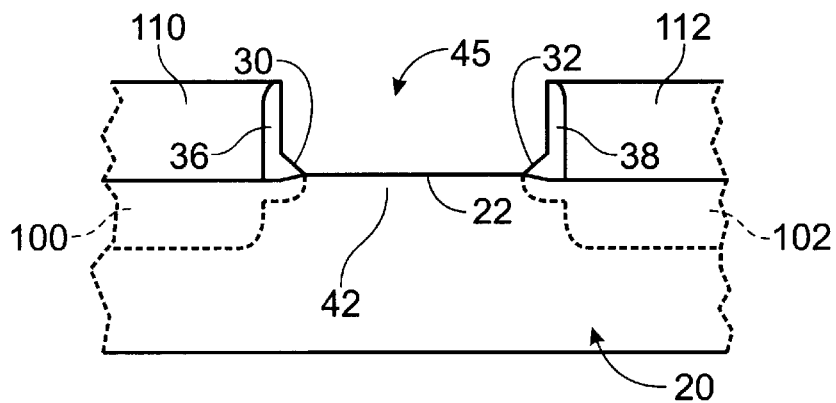
Figure 21:
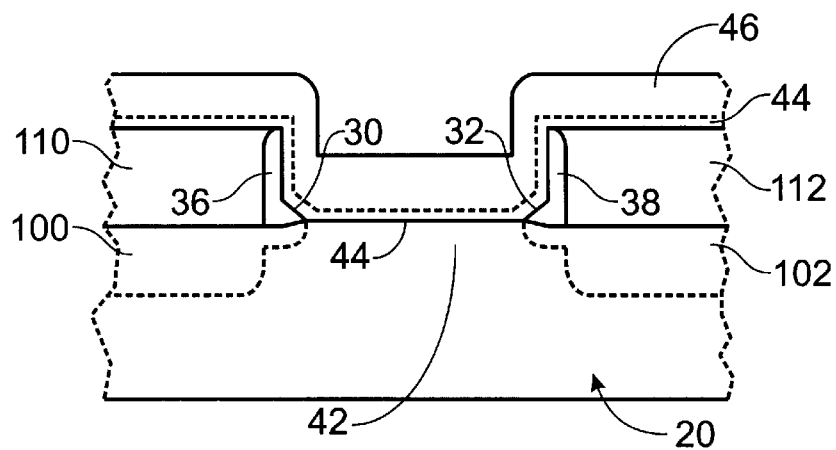
Figure 22:
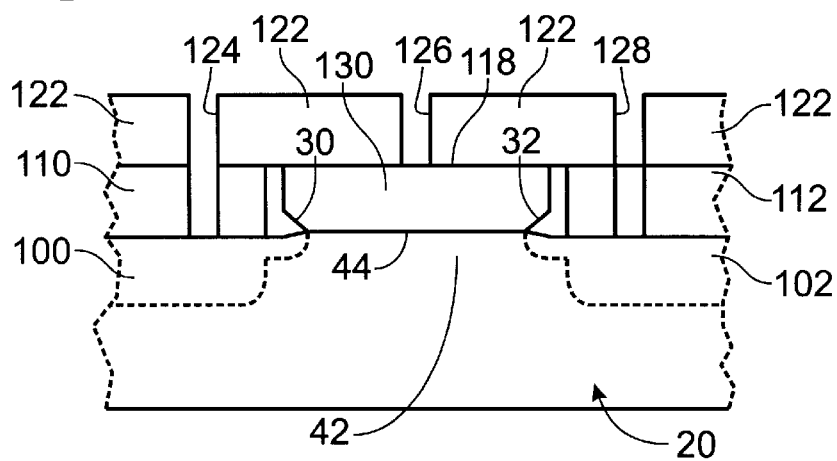

At this point the silicon germanium island 24 is removed by any suitable method which selectively removes the island 24 material but does not remove sidewall spacers 36, 38 or silicon dioxide regions 110 and 112. There are several wet etch processes, well known to those skilled in the art, that selectively remove silicon germanium over silicon dioxide or silicon nitride. The result of the removal step is the creation of void 45 over the gate region, or channel region 42, of the device, as shown in FIG. 20.

The formation of gate dielectric layer 44 (FIG. 21) and the deposit of gate electrode material layer 46 in the embodiment of FIGS. 17–22 is the same as previously described with reference to FIG. 10. The filling of void 45 with the gate structure is followed by planarizing the upper surface of the structure, to a level shown approximately by line 118 in FIG. 21. The planarizing step is carried out by chemical mechanical polishing.

Finally, a second layer of dielectric 122 is deposited over the planarized structure. Openings 124, 126, 128 are formed through layer 122, including opening 126 extending to gate structure 130, and openings 124 and 128, which extend also through first dielectric layer 110 and 112, to source and drain regions 100, 102, respectively. A suitable metal layer (not shown) is then deposited over the structure and into openings 124, 126, 128 to form electrodes in electrical contact with the source region 100, the gate region 130, and the drain region 102, completing the device.

Thus, a method of forming a MOSFET using a silicon germanium, or a similar alloy, replacement gate has been disclosed. Although preferred methods of forming the structure, and a SIMOX variation thereof, have been disclosed, it should be appreciated that further variations and modifications may be made thereto without departing from the scope of the invention as defined in the appended claims.

The present invention uses a new material for the dummy, or replacement, gate which can be selectively removed with better control of the gate critical dimension. In particular, silicon germanium replacement gates can be etched more quickly and patterned more easily than the replacement gates of the prior art. Moreover, use of silicon germanium or similar alloys as the replacement gate material allows the use of oxide or nitride spacers to form the replacement gate island whereas the polysilicon replacement gates of the prior art could only be formed with oxide spacers.

We claim:

1. A method of fabricating a MOSFET structure on a substrate comprising:

forming an island above a gate region in the substrate, said island being formed of $Si_{1-x}Ge_x$, wherein x is in the range of about 0.05 to about 1.0;

building a sidewall about said island;

forming a source region and a drain region in the substrate;

selectively removing the island without removing the sidewall, thereby leaving a void over the gate region; and filling the void with a gate structure.

2. A method of fabricating a MOSFET structure on a substrate comprising:

forming an island above a gate region in the substrate, said island being formed of a silicon germanium alloy;

building a sidewall about said island;

forming a source region and a drain region in the substrate;

selectively removing the silicon germanium alloy island by depositing a non-island-material layer over said island, the sidewall thereof, and the source region and the drain region; chemically mechanically polishing the structure to the top of said island; and dissolving said island with a solvent, thereby leaving a void over the gate region; and filling the void with a gate structure.

3. The method of claim 2 in which said non-island-material layer is a first layer of dielectric material.

4. The method of claim 3 wherein said first layer of dielectric material is selected from the group consisting of silicon nitride and oxide.

5. The method of claim 3 wherein, following the step of filling the void with a gate structure, the method includes planarizing the upper surface of the structure by chemical mechanical polishing.

6. The method of claim 5 wherein, following the step of planarizing the structure, the method includes depositing a second layer of dielectric material over the planarized structure, forming openings through said second layer of dielectric material to said gate structure, and forming opening through said second layer of dielectric material and through said first layer of dielectric material to said source and drain regions, and depositing a metal layer over the structure and into said openings to form electrodes in electrical contact with the source region, the gate region, and the drain region.

7. A method of fabricating a MOSFET structure on a substrate comprising:

forming an island above a gate region in the substrate, said island being formed of an alloy of Group IV-B elements;

building a sidewall about said island;

forming a source region and a drain region in the substrate;

selectively removing the island without removing the sidewall, thereby leaving a void over the gate region; and filling the void with a gate structure, including depositing a gate dielectric layer over the source region, the drain region, and the void, whereby a layer of gate dielectric is formed in the void, the gate dielectric deposited including material selected from the group comprising: $Ta_2O_5$, $TiO_2$, $ZrO_2$, $HfO_2$; the following materials doped with Si: $Ta_2O_5$, $TiO_2$, $ZrO_2$, $HfO_2$; and the following materials doped with Al: $Ta_2O_5$, $TiO_2$, $ZrO_2$, $HfO_2$, and then;

depositing a layer of gate electrode material over the layer of gate dielectric.

8. A method of fabricating a MOSFET structure on a substrate comprising:

forming an island above a gate region in the substrate, said island being formed of an alloy of Group IV-B elements;

building a sidewall about said island;

forming a source region and a drain region in the substrate;

selectively removing the island without removing the sidewall, thereby leaving a void over the gate region; and filling the void with a gate structure;

planarizing the upper surface of the structure by chemical mechanical polishing;

depositing a metal layer on the upper surface of the structure;

annealing the structure to promote a salicide process; and metallizing the structure to form electrodes in electrical contact with the source region, the gate structure, and the drain region.

9. A method of fabricating a MOSFET comprising:

depositing an oxide layer on a silicon substrate for device isolation;

forming a silicon tin alloy island above a gate region in the substrate;

building a sidewall about the silicon tin alloy island;

forming a source region and a drain region in the substrate;

removing the silicon tin alloy island, thereby leaving a void over the gate region;

filing the void and the areas over the source region and the drain region; and planarizing the upper surface of the structure by chemical mechanical polishing.

10. The method of claim 9 wherein the silicon tin alloy is represented by $Si_{1-x}Sn_x$, and wherein x is in the range of about 0.05 to about 1.0.

11. The method of claim 9 wherein the step of building a sidewall about the silicon tin alloy island comprises building the sidewall from a sidewall material chosen from the group consisting of silicon nitride and oxide.

12. A method of fabricating a MOSFET comprising:

depositing an oxide layer on a silicon substrate for device isolation;

forming a silicon germanium alloy island above a gate region in the substrate;

building a sidewall about the silicon germanium alloy island;

forming a source region and a drain region in the substrate;

removing the silicon germanium alloy island, thereby leaving a void over the gate region;

filing the void and the areas over the source region and the drain region; and planarizing the upper surface of the structure by chemical mechanical polishing.

13. The method of claim 12 wherein the silicon germanium alloy is represented by $Si_{1-x}Ge_x$, and wherein x is in the range of about 0.05 to about 1.0.

14. The method of claim 12 wherein the step of building a sidewall about the silicon germanium alloy island comprises building the sidewall from a sidewall material chosen from the group consisting of silicon nitride and oxide.

* * * * *